US010459352B2

(12) United States Patent
Chang et al.

(10) Patent No.: US 10,459,352 B2
(45) Date of Patent: Oct. 29, 2019

(54) MASK CLEANING

(71) Applicant: Taiwan Semiconductor Manufacturing Company, Ltd., Hsin-Chu (TW)

(72) Inventors: Shu-Hao Chang, Taipei (TW); Norman Chen, Hsinchu (TW); Jeng-Horng Chen, Hsinchu (TW); Kuo-Chang Kau, Yuanli Township (TW); Ming-Chin Chien, Hsinchu (TW); Shang-Chieh Chien, New Taipei (TW); Anthony Yen, Hsinchu (TW); Kevin Huang, Hinschu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 36 days.

(21) Appl. No.: 14/840,581

(22) Filed: Aug. 31, 2015

(65) Prior Publication Data
US 2017/0060005 A1   Mar. 2, 2017

(51) Int. Cl.
  *G03F 7/20*   (2006.01)
(52) U.S. Cl.
  CPC ...... *G03F 7/70866* (2013.01); *G03F 7/70925* (2013.01)
(58) Field of Classification Search
  CPC .................................. G03F 7/70866
  See application file for complete search history.

(56) References Cited

U.S. PATENT DOCUMENTS

| 6,387,602 | B1 * | 5/2002 | Hayden | G03F 1/82 134/1 |
| 2001/0005944 | A1 * | 7/2001 | Dao | G03F 1/62 34/412 |
| 2004/0103917 | A1 * | 6/2004 | Heerens | B08B 7/00 134/7 |
| 2004/0180270 | A1 * | 9/2004 | Heerens | G03F 1/66 430/5 |
| 2007/0206173 | A1 * | 9/2007 | Suzuki | G03F 1/66 355/75 |
| 2008/0117391 | A1 * | 5/2008 | Onvlee | G03F 7/707 355/30 |
| 2010/0151394 | A1 * | 6/2010 | Scaccabarozzi | G03F 7/70925 430/325 |
| 2010/0183987 | A1 * | 7/2010 | Yonekawa | G03F 7/70866 430/325 |
| 2011/0058147 | A1 * | 3/2011 | Ehm | B08B 7/0035 355/30 |
| 2011/0180108 | A1 * | 7/2011 | Pan | G03F 1/66 134/21 |

(Continued)

FOREIGN PATENT DOCUMENTS

CN    1776531    5/2006
TW    200625425   7/2006
(Continued)

*Primary Examiner* — Deoram Persaud
(74) *Attorney, Agent, or Firm* — Haynes and Boone, LLP

(57) ABSTRACT

A lithography system includes a load lock chamber comprising an opening configured to receive a mask, an exposure module configured to expose a semiconductor wafer to a light source through use of the mask, and a cleaning module embedded inside the lithography tool, the cleaning module being configured to clean carbon particles from the mask.

20 Claims, 12 Drawing Sheets

(56) References Cited

U.S. PATENT DOCUMENTS

| | | | | |
|---|---|---|---|---|
| 2012/0141923 | A1* | 6/2012 | Deweerd | G03F 1/48 430/5 |
| 2013/0255717 | A1* | 10/2013 | Rose | B08B 7/0021 134/1.1 |
| 2014/0007371 | A1* | 1/2014 | Lu | B08B 5/02 15/339 |
| 2014/0014138 | A1* | 1/2014 | Spiegelman | B08B 3/04 134/31 |
| 2014/0158157 | A1* | 6/2014 | Kobayashi | G03F 1/82 134/6 |
| 2014/0226136 | A1* | 8/2014 | Gagnon | G03F 1/82 355/30 |
| 2014/0268074 | A1* | 9/2014 | Chien | G03F 7/70741 355/30 |
| 2015/0128891 | A1 | 5/2015 | Hodebourg | |
| 2015/0323862 | A1* | 11/2015 | Chang | B08B 7/0021 134/1.1 |
| 2017/0052443 | A1* | 2/2017 | Lin | G03F 1/82 |

FOREIGN PATENT DOCUMENTS

| | | |
|---|---|---|
| TW | 201011454 | 3/2010 |
| TW | 201126581 | 8/2011 |
| TW | 201400206 | 1/2014 |
| TW | 201447471 | 12/2014 |
| TW | 201532141 | 8/2015 |

\* cited by examiner

MASK CLEANING

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. In one example associated with lithography patterning, a photomask (or mask) to be used in a lithography process has a circuit pattern defined thereon and is to be transferred to wafers. In advanced lithography technologies, an extreme ultraviolet (EUV) lithography process is implemented with a reflective mask. It is important that the EUV mask be as clean and defect free as possible.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
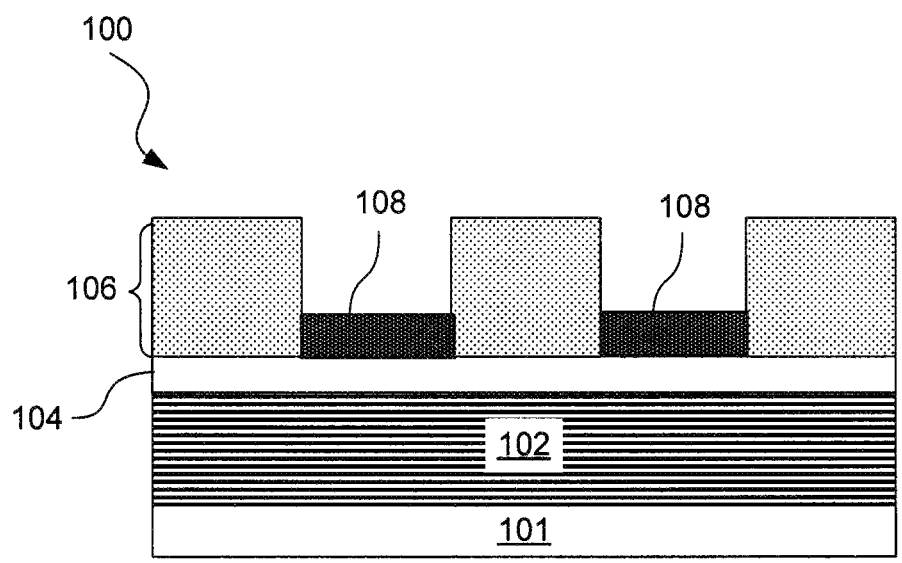
FIG. 1A is a diagram showing illustrative carbon buildup on a surface of a mask, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As described above, it is important that an EUV mask be as clean and defect-free as possible. It has been found that when an EUV mask is exposed to the atmosphere, a thin layer of carbon buildup accumulates on the surface of the mask. This layer of carbon buildup is typically less than 5 nanometers thick. This layer accumulates from the carbon of $CO_2$ gas within the atmosphere. The carbon buildup is a different issue than the particles that can accumulate during use of the mask.

With a typical lithography tool, a mask is inserted into a load lock chamber. The atmosphere is then pumped out of the load lock chamber so that the mask is within a vacuum. The mask can then be moved to the exposure chamber where it is used to form patterns on semiconductor wafers. A series of wafers are then passed through the exposure chamber so that the pattern of the mask is transferred to the wafers. The thin carbon buildup described above is naturally removed during the EUV exposure process. This is due to the hydrogen that is present within the exposure chamber. This hydrogen reacts with the carbon to remove the carbon buildup. However, the first couple of wafers are exposed with the carbon buildup not fully removed and thus the first couple of wafers are adversely affected. Our experiments found that the existing method to clean the mask is not effective. Further experiments identified that the cleaned mask is contaminated again when it is transferred from the cleaning module to the atmospheric environment and then to the lithography tool.

According to principles described herein, a cleaning module is integrated into the lithography tool. The cleaning module, which will be described in further detail below, is integrated within the lithography tool such that at some point after the mask is placed within a vacuum environment, the mask is cleaned to remove the carbon buildup and is transferred to the exposure module for lithography exposure. Particularly, the mask is cleaned, maintained and transferred for lithography exposure within the lithography tool under the vacuum condition. In one example, the cleaning module is integrated into the load lock chamber. In one example, the cleaning module is integrated into a discrete chamber between the load lock chamber and the exposure module. Other placements of the cleaning module within the lithography tool are contemplated as well. Through use of this cleaning module, the thin carbon buildup is removed before the first wafer is exposed. Thus, the first couple of wafers are not adversely affected.

FIG. 1A is a diagram showing illustrative carbon buildup 108 on a surface of a mask 100. According to the present example, the mask 100 includes a substrate 101, a reflective multilayer 102, a capping layer 104, and a patterning layer 106.

In one example, the mask 100 is an EUV mask. EUV lithography utilizes a reflective mask rather than a transmissive mask. EUV lithography utilizes scanners that emit light in the extreme ultraviolet (EUV) region, which is light having an extreme ultraviolet wavelength, such as 10-15 nm. In one example, the EUV source generates EUV with wavelength at about 13.6 nm. Some EUV scanners provide 4× reduction projection printing, similar to some optical scanners, except that the EUV scanners use reflective rather than refractive optics, i.e., mirrors instead of lenses; work in the vacuum environment; and some other differences. EUV scanners provide the desired pattern on an absorption layer ("EUV" mask absorber) formed on a reflective mask. Within the EUV range, all materials are highly absorbing. Thus, reflective optics rather than refractive optics are used.

The substrate 101 is made of a suitable material, such as a Low Thermal Expansion Material (LTEM) or fused quartz. In various examples, the LTEM includes TiO2 doped SiO2, or other suitable materials with low thermal expansion. In some examples, a conductive layer is additionally disposed under on the backside of the LTEM substrate 101 for the electrostatic chucking purpose. In one example, the conductive layer includes chromium nitride (CrN), though other suitable compositions are possible.

The mask 100 also includes a reflective multilayer 102 deposited on the substrate 101. The reflective multilayer 102 includes a plurality of film pairs, such as molybdenum-silicon (Mo/Si) film pairs (e.g., a layer of molybdenum above or below a layer of silicon in each film pair). Alternatively, the reflective multilayer 102 may include molybdenum-beryllium (Mo/Be) film pairs, or other suitable materials that are configurable to highly reflect the EUV light. The characteristics of the reflective multilayer 102 are selected such that it provides a high reflectivity to specific electromagnetic radiation type/wavelength. Specifically, for the purpose of EUV lithography, the reflective multilayer 102 is designed to reflect light within the EUV range. The thickness of each layer of the reflective multilayer 102 depends on the EUV wavelength and the incident angle. Particularly, the thickness of the reflective multilayer 102 (and the thicknesses of the film pairs) is adjusted to achieve a maximum constructive interference of the EUV light diffracted at each interface and a minimum absorption of the EUV light.

In some embodiments, the mask 100 further includes a capping layer 104 on the reflective multilayer 102. The capping layer 104 is designed to be transparent to EUV light and to protect the reflective multilayer 102 from damage and/or oxidation. In one example, the capping layer 104 is made of ruthenium. The ruthenium capping layer 104 can be formed as a crystal structure. The thickness of the capping layer may be within a range of about 2 to 7 nanometers.

The mask 100 also includes a patterning layer 106. The patterning layer 106 is used to form the desired exposure pattern 106 onto the mask. The patterning layer 106 may serve this purpose in a variety of ways. In one embodiment, the patterning layer 106 is an absorption material. In another embodiment, the patterning layer 106 is a phase shifting material, which is similar to the reflective multilayer 102 material.

In the case where the patterning layer 106 is an absorption material, the EUV mask 100 can be referred to as a Binary Intensity Mask (BIM). With a BIM, the remaining portions after the patterning layer 106 has been patterned are light absorbing, or opaque, regions. In the opaque regions, an absorber is present, and an incident light is almost fully absorbed by the absorber. In the reflective regions, the absorber is removed and the incident light is reflected by the underlying reflective multilayer 102. In some examples, the absorption material is chromium or other suitable absorption material.

In the case where the patterning layer 106 is a second reflective multilayer, the EUV mask can be referred to as a Phase Shifting Mask (PSM). With a PSM, the patterning layer 106 is a second reflective layer patterned with the integrated circuit design. The second reflective layer is designed so as to cause a phase difference (such as a 180 degree phase difference) between the light reflected from the reflective multilayer 106 and the light reflected from the reflective multilayer 102. The phase shifting mask may be an alternating phase shifting mask or an attenuated phase shifting mask. In some examples, the second reflective multilayer may be similar to the first reflective multilayer, such as alternating Mo/Si films.

As described above, when the mask 100 is exposed to the atmosphere, a thin carbon buildup 108 develops on the surface of the mask 100. For example, the mask 100 may be placed in storage for a few days between the times it is used. While in storage, the exposure to the atmosphere causes the carbon to form. The thin carbon buildup 108 adversely affects the reflective properties of the mask 100.

Figure 1B:
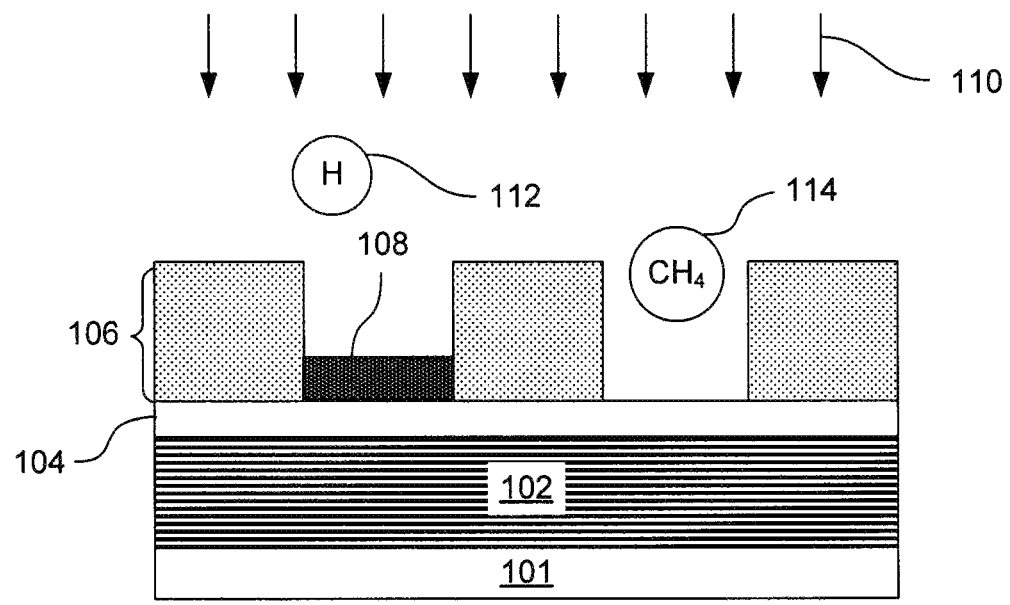
FIG. 1B is a diagram showing an illustrative cleaning process to remove the carbon buildup from the mask, according to one example of principles described herein.

FIG. 1B is a diagram showing an illustrative cleaning process to remove the carbon from the mask. When exposed to hydrogen 110, the carbon buildup 108 is removed by a chemical reaction. Specifically, the hydrogen 112 interacts with the carbon buildup 108 to form methane gas CH4 114. As described above, while this removal process occurs naturally during the exposure process, it is desirable that it occur before the exposure process. In some embodiments, the hydrogen includes hydrogen radicals. In some embodiments, the hydrogen includes hydrogen plasma. In some other embodiments, the hydrogen, having hydrogen radicals or hydrogen plasma, is further agitated by an ultrasonic wave so that to create wave in the hydrogen for enhanced cleaning effect.

Figure 2A:
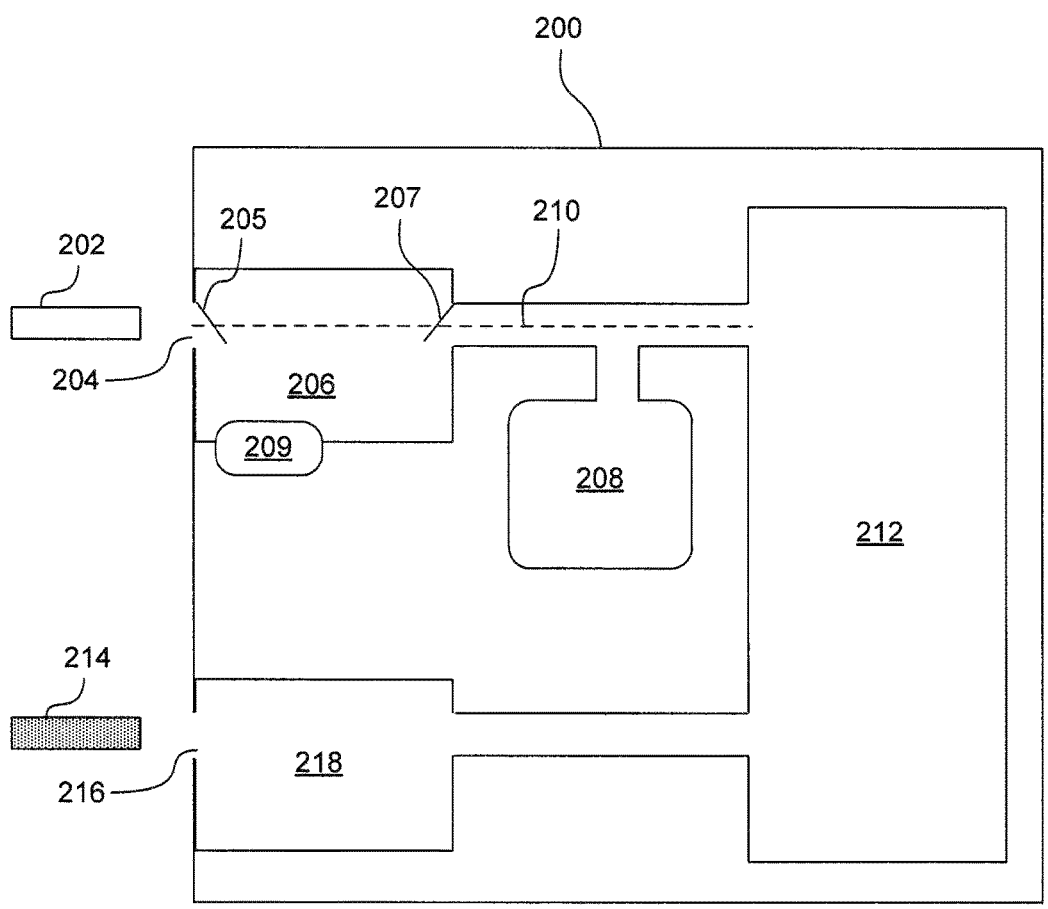
FIG. 2A is a diagram showing an illustrative lithography tool with an integrated cleaning module, according to one example of principles described herein.

FIG. 2A is a diagram showing an illustrative lithography tool 200 with an integrated cleaning module 208. According to the present example, the lithography tool 200 includes a mask load lock chamber 206, a wafer load lock chamber 218, an exposure module 212, and a mask path 210.

The mask load lock chamber 206 includes an external door 205 and an interior door 207. To insert a mask 202 into the mask load lock chamber 206, the interior door 207 is closed to isolate the mask load lock chamber 206 from other components of the lithography tool 200. Because the other components of the lithography tool 200 are in a vacuum, it is desirable to not expose those components to the atmosphere when the exterior door 205 is opened to allow the mask 202 to be inserted. The mask 202 is inserted into the lithography tool 200 through the opening 204 corresponding to the exterior door 205. The mask 202 may be inserted by a robotic mechanism (not shown) that is configured in the mask load lock chamber 206 of the lithography tool 200. After the mask 202 is inserted within the mask load lock chamber 206, the exterior door 205 is closed. The atmosphere is then pumped out of the mask load lock chamber 206 through a pump 209. After the mask 202 is within a vacuum environment, the interior door 207 can be opened and the mask 202 can be moved along a mask path 210 to the exposure chamber 212 or any other chamber within the lithography tool 200.

An internal robotic handling system (same one to receive the mask 202 from the opening 204 or different one) includes a variety of automated systems to move a mask through the lithography tool. For example, the robotic handling system may have robotically controlled arms to grasp a mask and move the mask from one module to another. The robotic handling system may include various motorized gears to move the robotic arms. The robotic handling mechanism may also include movable tracks on which a mask may be placed to move the mask between the modules. The robotic handling mechanism may include multiple robotic arms throughout the interior of the lithography tool 200. The robotic arms may be configured to place a mask in a precise location on a mask stage within various modules.

The mask path 210 refers to any path along which the mask 202 is moved while inside the lithography tool 200. Generally, the mask 202 is moved from the mask load lock chamber 206 to the exposure tool 212. According to principles described herein, however, the mask 202 is first moved along the mask path 210 to a cleaning module 208. The cleaning module 208 will be described in further detail below. In this example, the cleaning module 208 is positioned within a discrete chamber that is designed specifically to house the components of the cleaning module 208. After a cleaning process, the mask 202 can be moved to the exposure module 212.

The lithography tool 200 also includes a wafer load lock chamber 218 to receive one or more batch of wafers 214 through an opening 216. In some examples, wafers 214 are sent to the lithography tool 200 by a robotic handling system. The wafers 214 may be housed within a wafer box, such as a Front Opening Universal Pod (FOUP). Once inside the wafer load lock chamber, the wafers 214 are passed one-by-one through the lithography tool 200 so that they can be patterned by the exposure module 212.

Figure 2B:
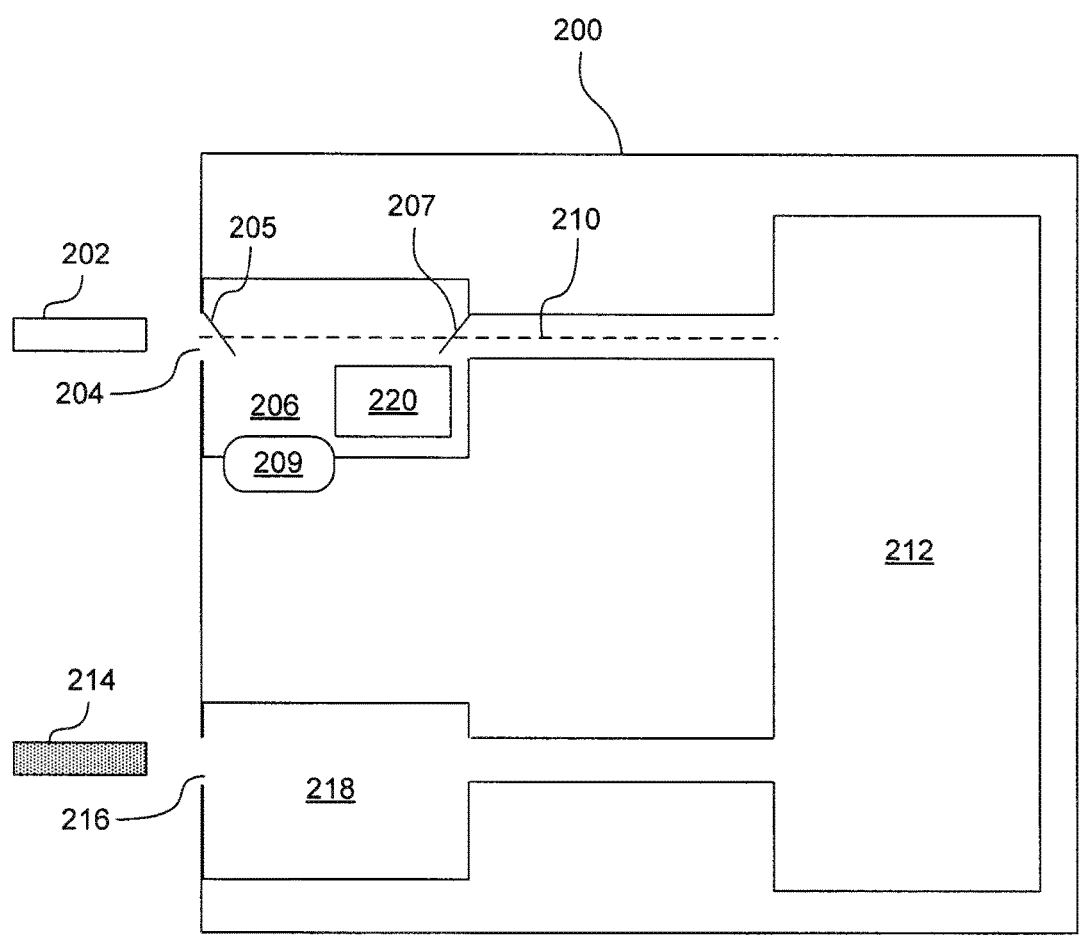
FIG. 2B is a diagram showing an illustrative lithography tool with a cleaning module integrated into a mask load lock chamber, according to one example of principles described herein.

FIG. 2B is a diagram showing an illustrative lithography tool 200 with a cleaning module 220 embedded in the mask load lock chamber 206. Thus, after the exterior door 205 is closed and the interior of the mask load lock chamber 206 becomes a vacuum environment, the mask 202 can be cleaned before the mask 202 exits the mask lock chamber 206 and is further transferred to other modules of the lithography tool 200, such as the library or the exposure chamber 212. The pump 209 can then be used to remove the hydrogen and the methane gas that results from the cleaning process.

Figure 2C:
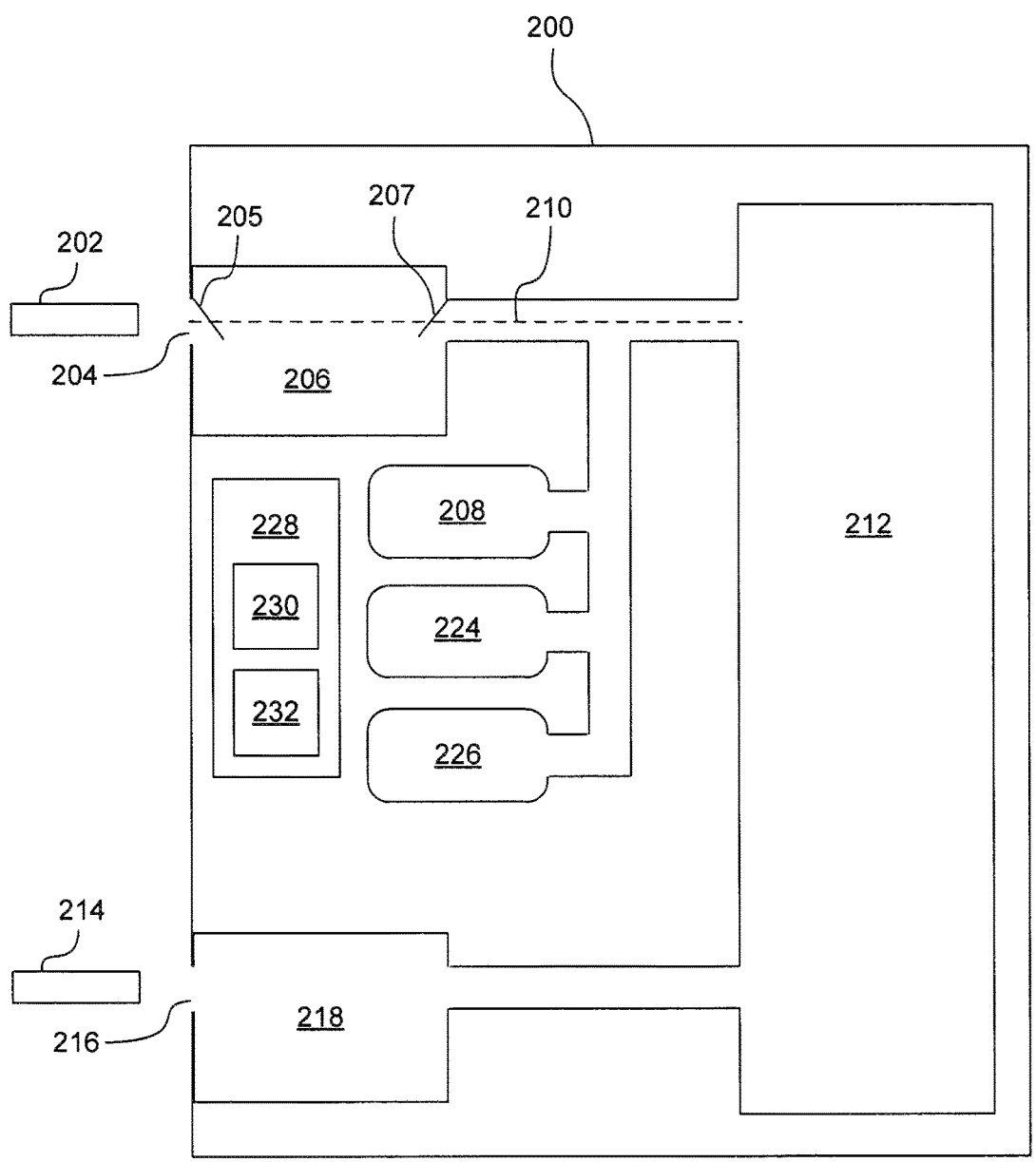
FIG. 2C is a diagram showing various features of a lithography tool with an integrated cleaning module, according to one example of principle described herein.

FIG. 2C is a diagram showing various features of a lithography tool with an embedded cleaning module. According to the present example, the lithography tool 200 also includes a control system 228, a mask library 224, and a mask inspection module 226. The lithography tool 200 also includes the embedded cleaning module 208.

The mask library 224 is used to store one mask or a plurality of masks. In one example, masks are placed into the mask library 224 after they are cleaned by the cleaning module 208. Thus, when any of the masks is needed, it can be transferred by the robotic handling mechanism from the mask library 224 to the exposure module 212.

The mask inspection module 226 is used to inspect masks. For example, after a mask 202 is cleaned, it can be inspected before being placed in either the mask library 224 or the exposure chamber 212. In some cases, the mask 202 may be inspected after a certain period of use within the exposure module 212. Normal use of the mask 202 may cause particle buildup on the mask, which is a separate issue from the carbon buildup (e.g. 108, FIG. 1) described above. The particle buildup may be cleaned using other techniques, such as another embedded cleaning module to remove the particles through another mechanism.

The control system 228 includes a processor 230 and a memory 232. The memory 232 may include machine readable instructions that when executed by the processor 230, cause the control system 228 to control various aspects of the lithography tool 200. For example, the control system 228 may control the robotic handling mechanism that moves masks and wafers through the lithography tool 200. The control system 228 may also control the individual modules. For example, after causing the robotic handling mechanism to move a mask into the cleaning module 208, the control system 228 can activate the cleaning module 208. More specifically, the control system 228 may control various conditions within the cleaning module 208 as will be discussed in further detail below.

Figure 3:
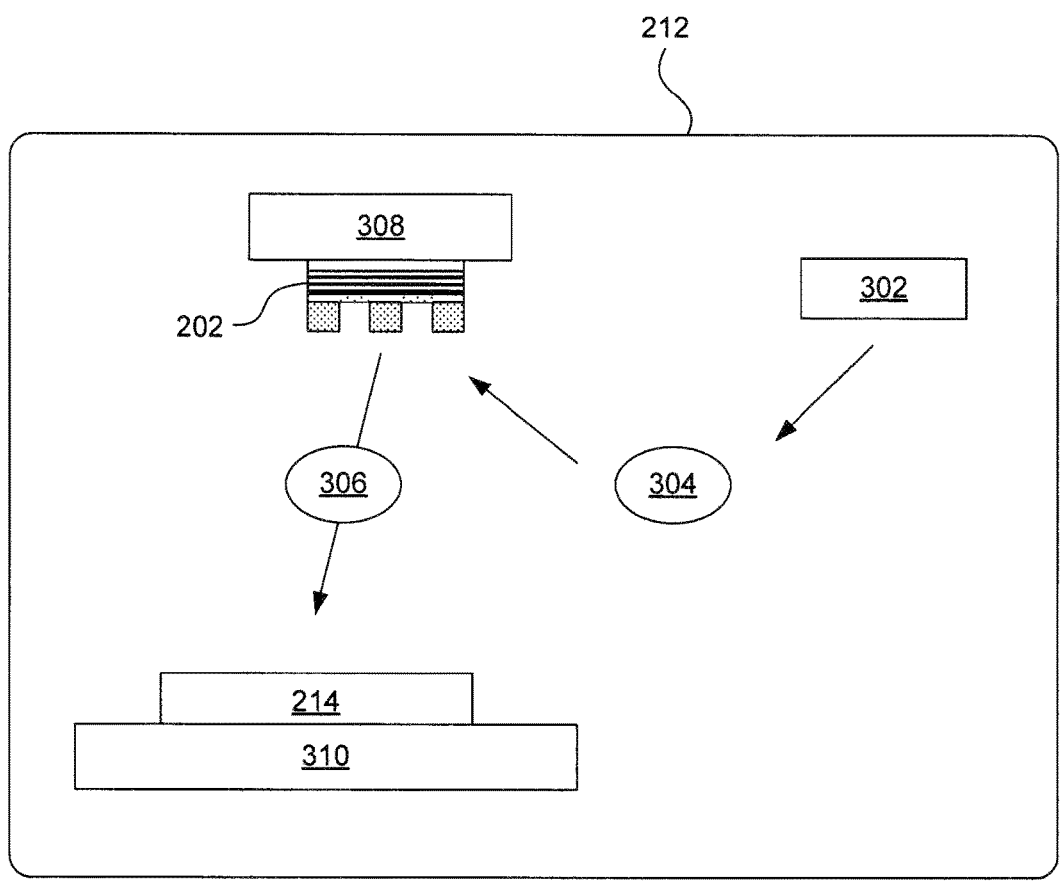
FIG. 3 is a diagram showing an illustrative exposure module, according to one example of principles described herein.

FIG. 3 is a diagram showing an illustrative exposure module 212. According to the present example, the exposure module 212 includes a radiation source 302, an illuminator module 304, and a projection module 306. The illuminator module 306 directs light from the radiation source at a mask 202 placed within the exposure module 212. The projection module 306 directs light reflected by the mask 202 to the wafer 214. The exposure module 212 further includes a mask stage to secure a mask and a wafer stage to secure a wafer.

The exposure module 212, which may also be generically referred to as a scanner, is operable to perform a lithographic exposure process utilizing a characteristic radiation source 302. In the illustrated example, the exposure module 212 is an EUV exposure module 212 designed to expose a workpiece, in this case a wafer 214, using EUV radiation. In some examples, the exposure module 212 includes a radiation source 302 that generates EUV radiation with a wavelength centered at about 13.5 nm. In one such example, the radiation source 302 utilizes laser-produced plasma (LPP) to generate the EUV radiation by heating a medium such as droplets of tin into a high-temperature plasma using a laser.

The illuminator module 304 that focuses and shapes the radiation produced by the radiation source 302. The illuminator module 304 may include refractive optical components, including monolithic lenses and/or array lenses (e.g., zone plates), and may include reflective optical components, including monolithic mirrors and/or mirror arrays. In some examples, the illuminator module 304 includes dozens or even hundreds of lenses and/or mirrors. The optical components are arranged and aligned to project radiation emitted by the radiation source 302 onto a mask 202 retained in a mask stage 308. The optical components of the illuminator module 304 may also shape the radiation along the light path in order to produce a particular illumination pattern upon the mask 202.

The mask 202 includes a number of reflective regions and absorptive regions. After being absorbed or reflecting off the mask 202, the radiation is directed through a projection module 306, also referred to as a projection optics box (POB). Similar to the illuminator module 304, the projection module 306 may include refractive optical components, including monolithic lenses and/or array lenses (e.g., zone plates), and may include reflective optical components, including monolithic mirrors and/or mirror arrays. The optical components of the projection module 306 are arranged and aligned to direct radiation transmitted through or reflecting off the mask 106 and to project that radiation onto a workpiece such as the wafer 214, which is secured to a wafer stage 310. In addition to guiding the radiation, the optical components of the projection module 306 may also enlarge, narrow, focus, and/or otherwise shape the radiation along the light path.

The radiation reflected by the mask 202 is used to expose the wafer 214 for photolithographic purposes. Radiation projected by the projection module 306 on the wafer causes changes in a photosensitive component of the workpiece. In a common example, the wafer 214 includes a photosensitive resist layer. Portions of the photosensitive resist layer that are exposed to the radiation undergo a chemical transition making them either more or less sensitive to a developing process. In one example, after exposure, the photosensitive resist layer undergoes a post-exposure baking, developing, rinsing, and drying in order to remove portions of the photosensitive resist layer and harden the remainder. Subsequent processing steps performed on the wafer 214 may use the patterned resist to selectively process portions of the wafer 214, such as etching using the patterned resist as an etch mask or ion implanting using the patterned resist as an implantation mask.

Figure 4A:
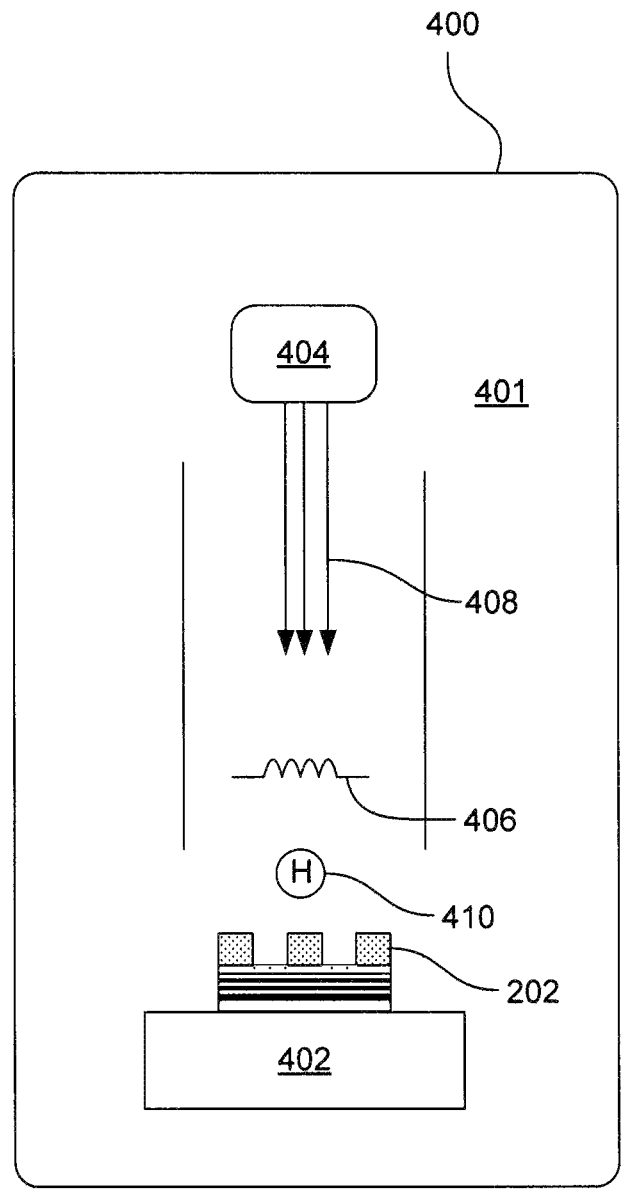
FIG. 4A is a diagram showing an illustrative cleaning module that uses hydrogen radicals, according to one example of principles described herein.

FIG. 4A is a diagram showing an illustrative cleaning module 400 that uses hydrogen radicals 410. According to the present example, the cleaning module 400 includes a chamber 401. Within the chamber 401 are a hydrogen gas source 404, a heating element 406, and a mask stage 402. The mask 202 can be placed within the mask stage 403 by a robotic handling mechanism (not shown).

The hydrogen gas source 404 is configured to direct $H_2$ (hydrogen gas) across the heating element 406 and onto the mask 202. In one example, the hydrogen gas 408 is provided at a flow rate that is greater than 2000 standard cubic centimeters per minute (sccm). Other flow rates are contemplated as well.

In one example, the heating element 406 is heated to a temperature that is greater than 1900 degrees Celsius. In one example, the heating element 406 is a filament. When the hydrogen gas 408 passes over the heated heating element 604, the hydrogen gas may produce hydrogen radicals 410. A hydrogen radical is a lone hydrogen atom that is neutrally charged. The hydrogen radical reacts with the carbon buildup (e.g. 108, FIG. 1) to form methane gas and removing the carbon from the mask 202. The cleaning module 400 may also include a pump (not shown) to remove the methane gas and unused hydrogen gas from the cleaning module chamber 401.

Figure 4B:
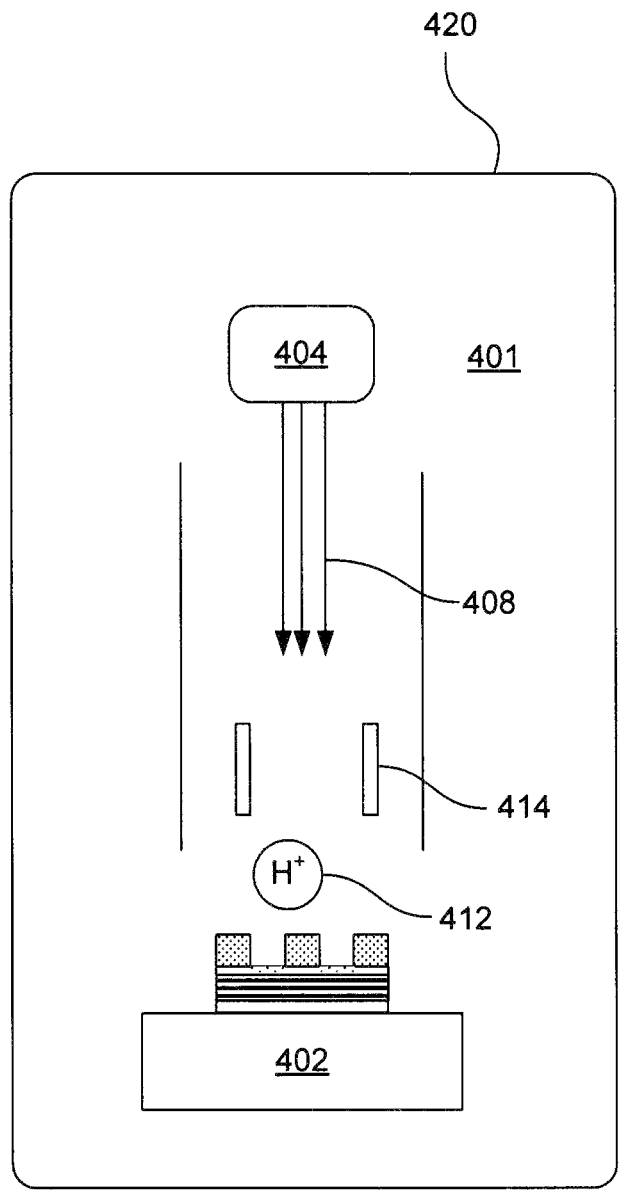
FIG. 4B is a diagram showing an illustrative cleaning module that uses hydrogen plasma, according to one example of principles described herein.

FIG. 4B is a diagram showing an illustrative cleaning module 420 that uses a plasma gas such as hydrogen plasma. According to the present example, the cleaning module 420 includes a chamber 401. Within the chamber 401 gas source 404, a plasma source 414, and a mask stage 402.

The plasma source 414 includes a conductive element. In the illustrated example, the conductive element is a capacitive element. In some examples, however, the conductive element 414 is an inductive element. In one example, an Alternating Current (AC) signal is applied to the conductive element 414. The AC signal may have a voltage within a range of 1-30 kilovolts. The AC signal may have a frequency within a range of about 1-40 kilohertz.

In the present example, a hydrogen gas is used. When the hydrogen gas 408 passes over the conductive element, hydrogen plasma 412 is created. Hydrogen plasma 412 includes positively charged hydrogen atoms ($H^+$). The plasma source 414 causes removal of the electron from the hydrogen atoms, thus leaving a positively charged atom. The hydrogen plasma 412 reacts with the carbon buildup (e.g. 108, FIG. 1) to create methane gas and remove the carbon buildup.

Other types of gas may be used instead of hydrogen. For example, inert gases such as oxygen ($O_2$), water ($H_2O$) in a gaseous state, or nitrogen ($N_2$). In some examples, inert gases may be used. Such inert gases may include, but are not limited to, helium (He) and Argon (Ar). In some examples, halogen gases may be used. Such halogen gases may include, but are not limited to, fluorine ($F_2$) and chlorine ($Cl_2$). Such gases may be passed by the plasma source 414 to create a corresponding plasma gas that reacts with the carbon buildup 108 to remove that carbon. The frequency and voltage level of the signal applied to the plasma source 414 may be tuned for a specific gas to create the plasma for that gas.

In some examples, a gas may be heated and passed over the mask to clean the carbon buildup. For example, a gas may be heated to a temperature within a range of about 350-900 degrees Fahrenheit. The heated gas may be any type of gas that is suitable for cleaning the carbon buildup 108 from the mask.

Figure 4C:
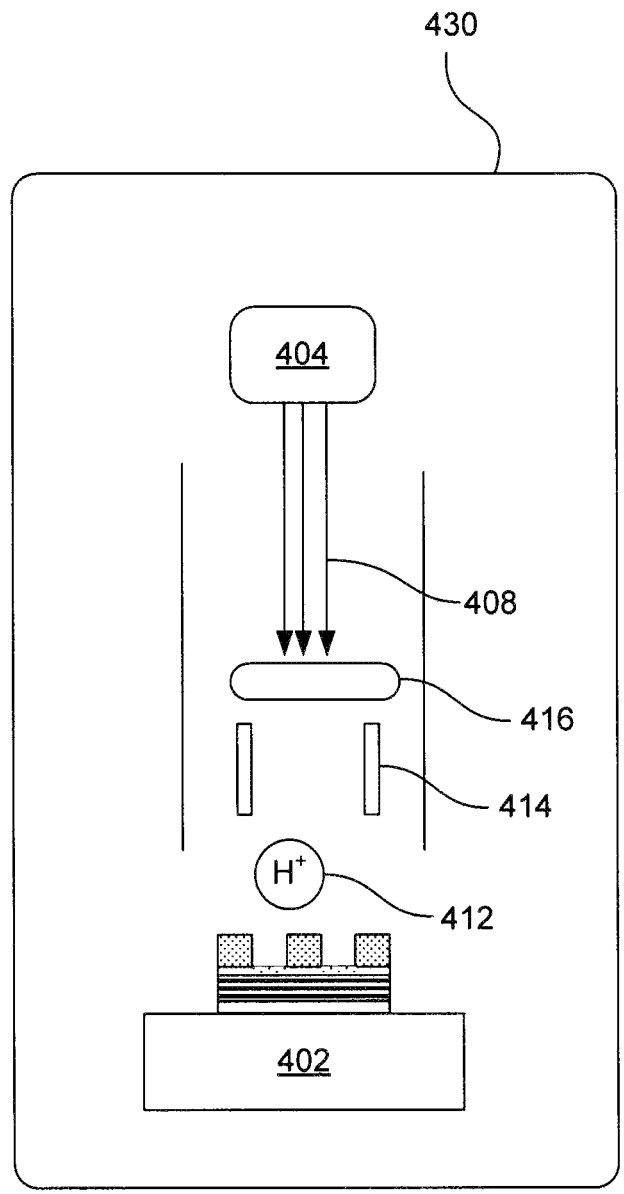
FIG. 4C is a diagram showing an illustrative cleaning module that includes an ultrasonic wave generator, according to one example of principles described herein.

FIG. 4C is a diagram showing an illustrative cleaning module 430 that includes an ultrasonic wave generator 416. The ultrasonic wave generator 416 produces waves within the hydrogen 408 being directed at the mask. The ultrasonic wave generator 416 may produces waves at a frequency of 20 kilohertz or more. The ultrasonic waves can improve the efficiency of the cleaning module 430. The ultrasonic wave generator 416 may also be used in the cleaning module of FIG. 4A that uses hydrogen radicals. In some embodiments, the ultrasonic wave generator 416 is configured to generate wave within the hydrogen plasma or hydrogen radicals.

The cleaning modules 400, 420, 430 may be controlled by the control system (e.g. 228, FIG. 2C) to apply the cleaning process to a mask for a set period of time. For example, the cleaning process may be applied within a range of about 2 to 3 minutes. Other cleaning process times are contemplated. The cleaning modules 400, 420, 430 may be implemented in any of the examples described above. For example, any of the cleaning modules 400, 420, 430 may be integrated into the load lock chamber (e.g. 206, FIG. 2A) or be part of a discrete chamber within the lithography tool.

Figure 4D:
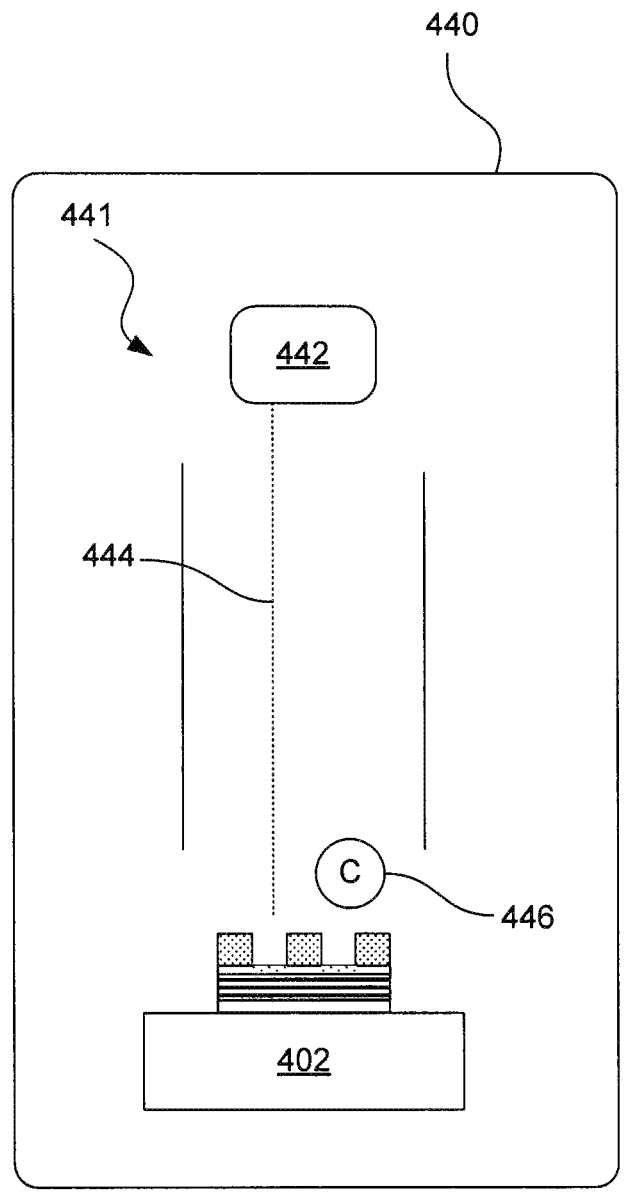
FIG. 4D is a diagram showing an illustrative cleaning module that includes a laser cleaning system, according to one example of principles described herein.

FIG. 4D is a diagram showing an illustrative cleaning module 440 that includes a laser decomposition cleaning system 441. According to the present example, the laser decomposition cleaning system 441 includes a laser source 442 configured to produce and/or direct a laser beam 444 at the surface of the mask to remove the carbon buildup 108. By directing a laser beam with certain parameters at the mask, the carbon buildup can be decomposed and pumped out of the cleaning module 440. The laser beam 444 can be configured to scan across the surface of the mask. In some examples, the laser source may produce multiple laser beams simultaneously.

In one example, the laser source 442 may produce a laser with an average output power within a range of about 1-20 watts. The laser may have pulse energy within a range of about 1-10 millijoules. The laser may have a peak power at about 100 kilowatts. The laser may have a pulse duration of about 100 nanoseconds. The laser may have a repetition rate within a range of 1-5 kilohertz. The laser may have a linear scan speed of about 20 millimeters per second. The laser may have a spot diameter within a range of about 0.1-0.5 millimeters. Other parameter ranges that will sufficiently decompose the carbon buildup 108 are contemplated as well.

Figure 4E:
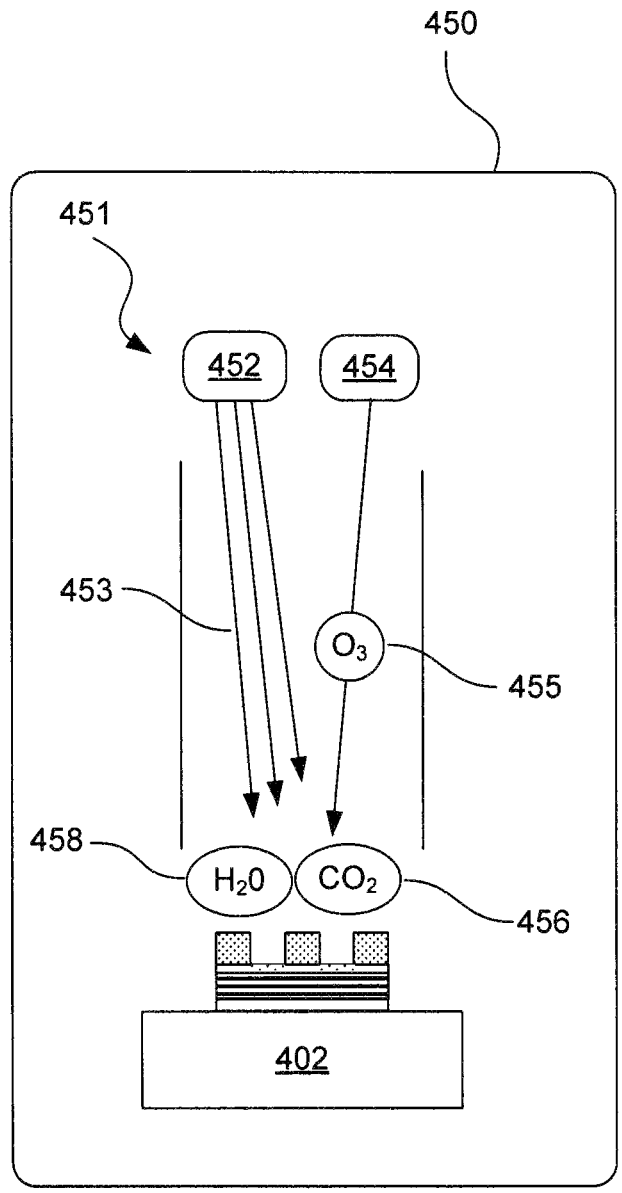
FIG. 4E is a diagram showing an illustrative cleaning module that includes an ultraviolet ozone cleaning system, according to one example of principles described herein.

FIG. 4E is a diagram showing an illustrative cleaning module 450 that includes an ultraviolet ozone cleaning system 451. According to the present example, the ultraviolet ozone cleaning system 451 includes an ultraviolet (UV) light source 452 and an ozone ($O_3$) source 454. The UV light source 452 produces UV light 453 at specific wavelengths to break the bonds in the ozone 455. The broken-up oxygen atoms may then bond with the carbon on the surface of the mask to create carbon dioxide ($CO_2$). The carbon dioxide may be removed from the cleaning module with a pumping mechanism. In some cases, if there is hydrogen within the carbon buildup 108 of the mask, then that hydrogen is removed as $H_2O$ after reacting with the oxygen atoms.

The UV light source 452 can produce light 453 at a wavelength that is tuned to break up certain types of chemical bonds. For example, to break the chemical bonds of the ozone 455, the UV light source 452 can produce light having a wavelength of about 253.7 nanometers. In some cases, the ozone source 454 may provide oxygen ($O_2$) as well as ozone 455. The UV light source 452 may also produce light 453 having a wavelength of about 184.7 nanometers to break up the bonds that hold the atoms from the oxygen ($O_2$) together.

Figure 4F:
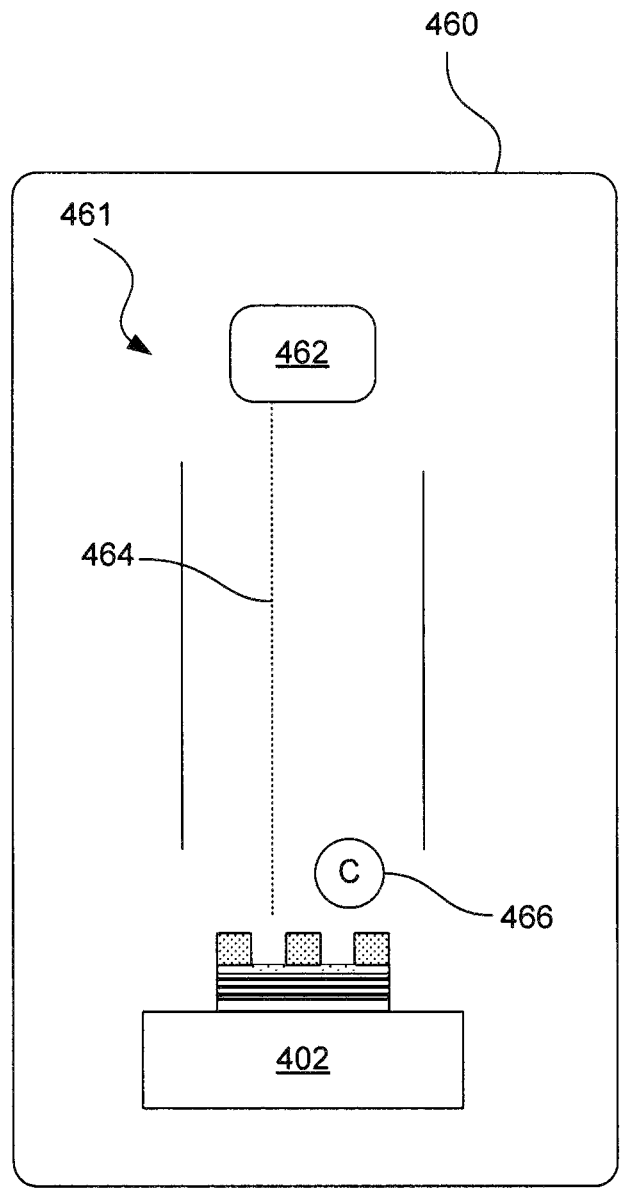
FIG. 4F is a diagram showing an illustrative cleaning module that includes an electron beam cleaning system, according to one example of principles described herein.

FIG. 4F is a diagram showing an illustrative cleaning module that includes an electron-stimulated desorption cleaning system 461. According to the present example, the electron-stimulated desorption cleaning system 461 includes an electron beam source 462 that produces an electron beam 464. The electron beam 464 is directed onto the mask. The electron beam 464 may remove carbon particles from the mask through a process referred to as electron-stimulated desorption. The electron beam 464 may be scanned across the surface of the mask to remove the carbon buildup 108.

Electron-stimulated desorption occurs as a result of an electron beam upon a surface in a vacuum. While the mask is exposed to the atmosphere at normal atmospheric pressure, various molecules may weakly bond to the surface of the mask. This weak bonding of atmospheric molecules is referred to as adsorption. The molecules may form monolayers at a density of about $10^{15}$ atoms per square centimeter. In some cases, multiple monolayers of molecules may form on the surface of the mask depending on the bonding capabilities of such molecules. The electron beam 464, when incident on the surface of the mask, may provide enough energy to break the bonds that hold the molecule monolayers in place. The removed molecules can then be removed through a pumping system that is used to create a vacuum within the cleaning module 460. Because such molecules are pumped out, there are fewer molecules available to cause re-adsorption. In some cases, an increasing number of electrons may be provided to maintain constant desorption.

In some cases, a cleaning module may have multiple cleaning systems as described in FIGS. 4A-4F formed therein. For example, a cleaning module may utilize any combination of hydrogen radicals, plasma gases, laser decomposition, ultraviolet ozone, and electron-stimulated desorption. The various cleaning processes associated with the respective cleaning systems may be performed simultaneously or sequentially.

Figure 5:
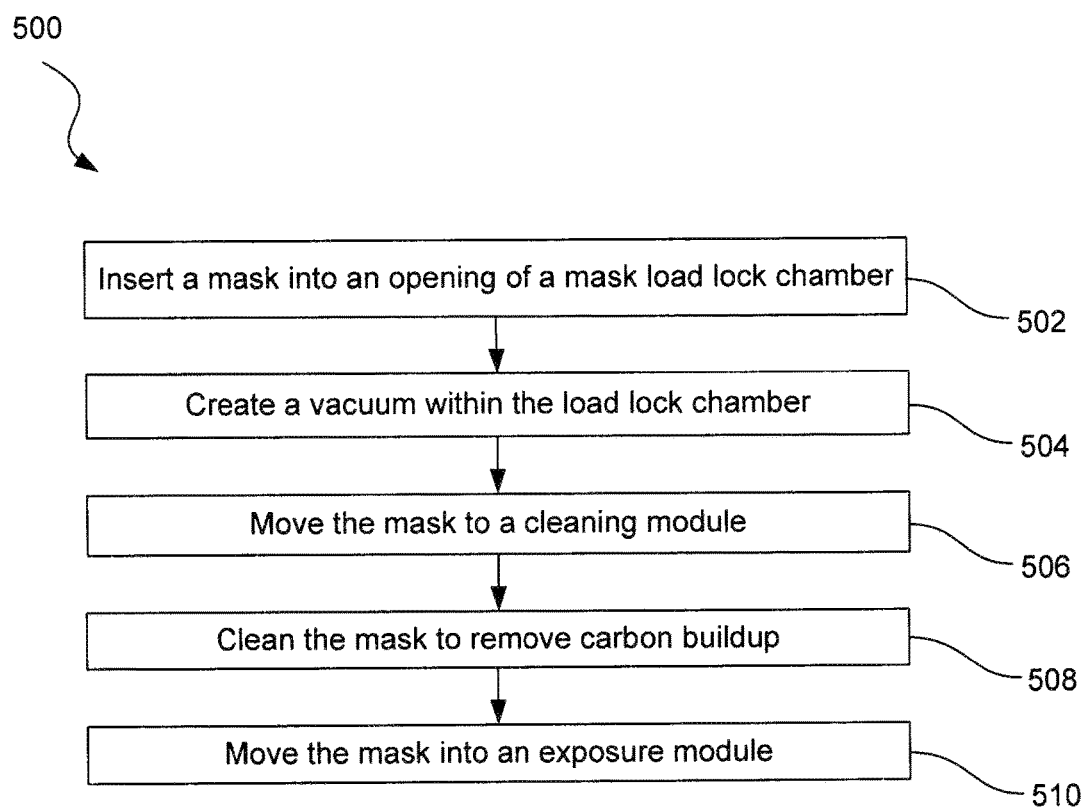
FIG. 5 is a flowchart showing an illustrative method for using a lithography tool with an integrated cleaning module, according to one example of principles described herein.

FIG. 5 is a flowchart showing an illustrative method 500 for using a lithography tool with an integrated cleaning module. According to the present example, the method 500 includes a step 502 for inserting a mask into an opening of a mask load lock chamber. This may be done by a robotic handling mechanism.

The method 500 further includes a step 504 for creating a vacuum within the mask load lock chamber. Specifically, after the mask is fully within the load lock chamber, the door between the load lock chamber and the environment external to the lithography tool is closed. Then, the atmosphere is pumped out of the load lock chamber.

The method 500 may further include a step 506 for moving the mask to a cleaning chamber. The mask may be moved by the robotic handling mechanism. The mask stays in a vacuum environment during this process.

The method 500 further includes a step 508 for cleaning the mask to remove carbon buildup. This may be done using hydrogen radicals, hydrogen plasma, or a combination of both. The cleaning process may be applied for a set period of time. In one example, the cleaning process is applied for 2.5 minutes.

The method 500 further includes a step 510 for moving the mask into the exposure module. This may be done by the robotic handling mechanism. During this step, the mask stays within a vacuum environment. Thus, no additional carbon buildup occurs. The mask is thus ready to go for the first exposure process for the first wafer placed within the exposure module. In some examples, the mask may be moved to a mask library after being cleaned. When the mask is ready for use, it can then be moved from the mask library to the exposure tool. Because the mask library is also a vacuum environment, the carbon buildup does not occur on the mask while it is in the library. Thus, the mask is ready to be used when it is moved from the mask library to the exposure module.

According to one example, a lithography system includes a load lock chamber comprising an opening configured to receive a mask, an exposure module configured to expose a semiconductor wafer to a light source through use of the mask, and a cleaning module embedded inside the lithography tool, the cleaning module being configured to clean carbon particles from the mask.

According to one example, a lithography system includes an opening, an exposure module to expose a wafer to a light source, a robotic mechanism to move a mask between the opening and the exposure module, a cleaning module, and a control system comprising a processor and a memory comprising machine readable instructions that when executed by the processor to cause the robotic mechanism to receive the mask through the opening, cause the robotic mechanism to place the mask in the cleaning module, and cause the cleaning module to clean the mask.

According to one example, a method includes loading a mask into a lithography tool, while the mask is in the lithography tool, causing the mask to be within a vacuum environment, using hydrogen to remove carbon particles from a surface of the mask while the mask is in the lithography tool, and while keeping the mask in a vacuum environment, transferring the mask to an exposure module for implementing a lithography exposure process using the mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein.

Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography system comprising:
    a load lock chamber comprising an opening configured to receive a mask;
    an exposure module configured to expose a semiconductor wafer to a light source through use of the mask; and
    a cleaning module embedded inside the lithography tool, the cleaning module being configured to clean carbon particles from the mask;
    wherein the cleaning module is integrated into the load lock chamber.

2. The lithography tool of claim 1, wherein the lithography tool is an Extreme Ultra-Violet (EUV) lithography tool, the mask is an EUV mask, and the light source is an EUV light source.

3. The lithography system of claim 1, wherein the cleaning module is configured to produce hydrogen radicals.

4. The lithography system of claim 3, wherein the cleaning module comprises:
    a filament configured to be heated to heat to a temperature greater than 1900 degrees Celsius; and
    a gas source configured to pass hydrogen gas over the filament to produce the hydrogen radicals.

5. The lithography system of claim 1, wherein the cleaning module is configured to produce a plasma gas including at least one of: hydrogen, oxygen, nitrogen, argon, helium, fluorine, and chlorine.

6. The lithography system of claim 1, wherein the cleaning module comprises one of: a laser decomposition cleaning system, an ultraviolet ozone cleaning system, and an electron-stimulated desorption cleaning system.

7. The lithography system of claim 1, wherein the cleaning module comprises an ultrasonic wave producer positioned to create wave within a gas.

8. The lithography system of claim 1, further comprising a library module configured to store a plurality of masks, the library being positioned between the load lock chamber and the exposure tool, wherein the cleaning module comprises a pump configured to pump gas out of the cleaning module.

9. A lithography system comprising:
    an opening;
    an exposure module to expose a wafer to a light source;
    a robotic mechanism to move a mask between the opening and the exposure module;
    a cleaning module; and
    a control system comprising a processor and a memory comprising machine readable instructions that when executed by the processor to:
        cause the robotic mechanism to receive the mask through the opening;
        cause the robotic mechanism to place the mask in the cleaning module; and
        cause the cleaning module to clean the mask;
    wherein the cleaning module is integrated into a load lock chamber of the lithography system.

10. The system of claim 9 wherein the control system is further to create a vacuum in the load lock chamber to after receiving the mask.

11. The system of claim 9, wherein the control system is further to cause the cleaning module to:
    heat a filament; and
    pass a gas over the filament at a flow rate greater than 2000 sccm.

12. The system of claim 9, wherein the control system is further to cause the cleaning module to:
    apply an Alternating Current (AC) signal to a plasma source, the AC signal having a voltage within a range of about 1 to 30 kilovolts and a frequency within a range of 1-40 kilohertz; and
    pass a gas over the filament at a flow rate greater than 2000 sccm.

13. The system of claim 9, wherein the control system is further to cause the cleaning module to:
    pass a gas over a plasma source at a flow rate greater than 2000 sccm; and
    generate a plasma gas from the gas using a plasma source.

14. The system of claim 13, wherein the control system is further to cause the cleaning module to:
    create wave within the plasma gas using an ultrasonic wave producer.

15. A method comprising:
    loading a mask into a lithography tool;
    while the mask is in the lithography tool, causing the mask to be within a vacuum environment of a cleaning module;
    using a gas to remove carbon particles from a surface of the mask while the mask is in the lithography tool; and
    while keeping the mask in a vacuum environment, transferring the mask to an exposure module for implementing a lithography exposure process using the mask;
    wherein the cleaning module is integrated into a load lock chamber of the lithography tool.

16. The method of claim 15, wherein the gas comprises at least one of: oxygen, nitrogen, hydrogen, an inert gas, and a halogen gas.

17. The method of claim 16, further comprising heating the gas to a temperature within a range of about 350 to 900 degrees Fahrenheit.

18. The method of claim 15, wherein using a gas to remove the carbon particles from the surface of the mask comprises applying an Alternating Current (AC) signal to a plasma source.

19. The method of claim 18, wherein using a gas to remove the carbon particles from the surface of the mask comprises passing a gas over the filament at a flow rate greater than 2000 sccm.

20. The method of claim 15, wherein using a gas to remove the carbon particles from the surface of the mask comprises creating wave within the gas using an ultrasonic wave producer.

* * * * *